US007920743B2

(12) United States Patent
Burgess

(10) Patent No.: US 7,920,743 B2
(45) Date of Patent: Apr. 5, 2011

(54) DISPLAYING TIME SEQUENCE OF 2-DIMENSIONAL DATA

(75) Inventor: David E. Burgess, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1239 days.

(21) Appl. No.: 11/521,269

(22) Filed: Sep. 13, 2006

(65) Prior Publication Data

US 2008/0062209 A1    Mar. 13, 2008

(51) Int. Cl.
*G06K 9/66* (2006.01)
*G06K 9/46* (2006.01)
*G06T 11/20* (2006.01)
*G09G 5/22* (2006.01)
*G09G 5/10* (2006.01)

(52) U.S. Cl. ........ 382/207; 382/191; 382/208; 345/691; 345/440; 345/441; 345/440.1

(58) Field of Classification Search .................. 382/118; 345/691
See application file for complete search history.

(56) References Cited

U.S. PATENT DOCUMENTS

| | | | | |
|---|---|---|---|---|
| 5,796,869 A * | 8/1998 | Tsuji et al. | ..................... | 382/203 |
| 5,953,439 A * | 9/1999 | Ishihara et al. | ............... | 382/107 |
| 6,415,197 B1 * | 7/2002 | Prewitt | .......................... | 700/117 |
| 7,006,092 B2 * | 2/2006 | Guenther | ................... | 345/440.1 |
| 7,218,755 B2 * | 5/2007 | Smaragdis et al. | ........... | 382/103 |
| 7,366,736 B1 * | 4/2008 | Woodard | ....................... | 345/428 |
| 7,499,046 B1 * | 3/2009 | Wright et al. | ................. | 345/418 |
| 2002/0076120 A1 * | 6/2002 | Loce et al. | ..................... | 382/300 |
| 2005/0072605 A1 * | 4/2005 | Kunzi et al. | .................... | 177/126 |
| 2006/0063473 A1 * | 3/2006 | Blake et al. | ....................... | 451/8 |
| 2006/0167699 A1 * | 7/2006 | Rontynen et al. | ................. | 705/1 |
| 2006/0282302 A1 * | 12/2006 | Hussain | ........................... | 705/9 |

* cited by examiner

*Primary Examiner* — Vikkram Bali
*Assistant Examiner* — Michelle Entezari
(74) *Attorney, Agent, or Firm* — Francis I. Gray; Michael A. Nelson

(57) ABSTRACT

A method of displaying a time sequence of 2-dimensional data represents each data set in the time sequence as a normalized figure based upon a reference set of data. The perimeter of the normalized figure is color coded to represent deviations from a data standard that corresponds to the 2-dimensional data. For subsequent data sets in the time sequence each normalized figure is sized to form a series of concentric figures for display representing all the data sets in the time sequence so that patterns of both rotational and magnitude changes are visually apparent.

14 Claims, 1 Drawing Sheet

DISPLAYING TIME SEQUENCE OF 2-DIMENSIONAL DATA

BACKGROUND OF THE INVENTION

The present invention relates to a method of displaying 2-dimensional data, and more particularly to a method of visualizing a time sequence of vector information associated with data that may be referenced to a unit or normalized figure, like a circle.

Currently display techniques overlap time sequential data on the same display, making it difficult to distinguish changes that occur over time or to display all the useful data, i.e., they either don't provide an effective means to visualize 2-dimensional data that has more than one value on an axis or don't provide an effective means to identify the time sequencing. Constellation diagrams, Radar diagrams, Spectrograms and waterfall diagrams all have difficulty displaying this data in a way that patterns may be detected.

Constellation diagrams are a current technique for displaying 2-dimensional data, like digital modulation of a radio frequency (RF) signal. The problem with the Constellation diagrams is that all information is plotted on the same 2-dimensional axis and the time sequence is difficult to distinguish. The best approach for determining time sequence is to use a marker that may be manipulated along the time sequence of the display data. This is time consuming and not very effective for determining time related patterns.

Radar diagrams are similar to Constellation diagrams and have similar limitations when trying to address time sequencing.

Spectrograms are another current technique for displaying a time sequence of 2-dimensional data, like trace data. The problem with Spectrogram displays are that it requires that there is one value that represents all the useful data for any given frequency or position in a displayed trace "line", i.e., there is one axis for which there is a unique value for each measurement on that axis. The information presented in a Constellation diagram is not readily mapped to a Spectrogram-type display without significant confusion or loss of information because there is no axis for which this is true, i.e., there may be two values for each measurement on a particular axis in the Constellation diagram.

Waterfall diagrams are yet another current technique to display a time sequence of 2-dimensional data, similar to Spectrograms. Unfortunately this display technique also uses a surface or sequence of lines to represent all the useful information. Since this has the same limitations on data translation as a Spectrogram, it too doesn't readily translate the information from a Constellation diagram without significant confusion or loss of information.

What is desired is a method for displaying a time sequence of 2-dimensional data that distinguishes changes that occur over time while displaying all the useful data.

BRIEF SUMMARY OF THE INVENTION

Accordingly the present invention provides a method of displaying a time sequence of 2-dimensional data in the form of a normalized or unit figure, such as a circle. The 2-dimensional data is acquired as time sequential data sets. Each data set is represented by a normalized figure, and the perimeter of the normalized figure is color coded according to deviations from a normalized reference standard. The normalized figures for the time sequence are sized to form concentric figures so that patterns of rotational and/or magnitude changes are visually apparent when displayed.

The objects, advantages and other novel features of the present invention are apparent from the following detailed description when read in conjunction with the appended claims and attached drawing.

DETAILED DESCRIPTION OF THE INVENTION

Figure 1:
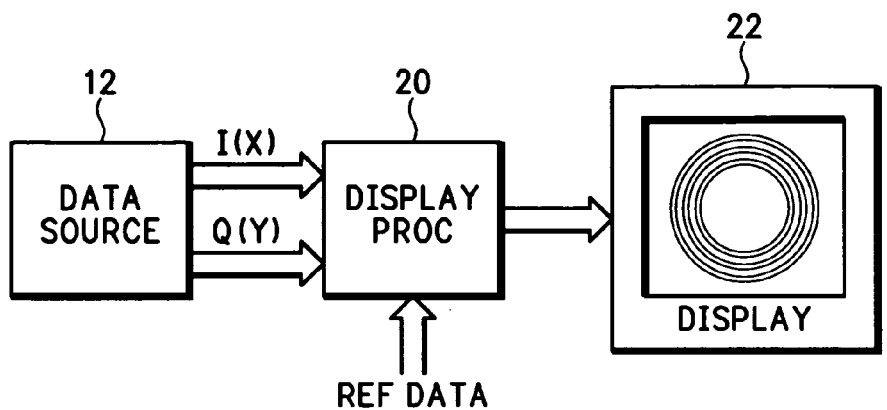
FIG. 1 is a block diagram view of a device for displaying a time sequence of 2-dimensional data according to the present invention.

Referring now to FIG. 1 a typical device for generating and displaying a time sequence of 2-dimensional data is shown. A data source 12, which may be any device that provides 2-dimensional data such as a spectrum analyzer, digital oscilloscope or other test and measurement instrument that samples an input signal to produce the 2-dimensional data or a computer graphics system, etc., inputs the 2-dimensional data (I,Q or X,Y) to a display processor 20. Input also to the display processor 20 are reference data that define the normalized standard for the data being processed. The normalized standard is displayed as a normalized figure on a display device 22, with deviations from the normalized standard as represented by the acquired 2-dimensional data being displayed as variations on the normalized figure. For ease of understanding, the following description uses a circle as the normalized figure, but any normalized figure is possible.

Figure 2:
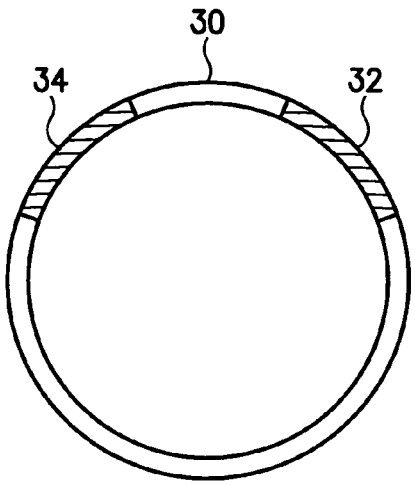
FIG. 2 is a plan view of a normalized figure for display a time sequence of 2-dimensional data according to the present invention.

The display shown in FIG. 2 allows for the significant 2-dimensional data to be retained along with the ability to represent time sequences in a consistent and readily understood manner. There are two parts to the display. The first part is to use color, or other distinctive shadings or markings, to represent the variations on the normalized figure, in this example a unit circle, corresponding to deviations from the reference data. The second part is to use concentric figures, i.e., circles, to represent time or history. The unit circle is the normalized standard derived from the reference data, and any 2-dimensional information that deviates from the standard is represented as variations on the circle. The radius of the circle represents the ideal or normalized standard. Again the technique described here may be extended to any regular shape that can be plotted concentrically without overlapping.

Color preferably is used to map deviations of the 2-dimensional data from the reference data on the unit circle onto a displayed circle 30 of fixed thickness. One end of the visual spectrum, such as red, may represent deviations 32 greater than the standard represented by the unit circle, and the other end of the visual spectrum, such as blue, may represent deviations 34 smaller than the standard. The closer to the end of the visual spectrum, the greater the deviation of the 2-dimensional data from the standard is being represented. The resulting displayed circle 30 represents one set or acquisition of 2-dimensional data. The display processor 20 generates the normalized figure for each data set, and then compares the 2-dimensional data with the reference data provided according to the normalized standard to determine the deviations. The display processor 20 then uses the determined deviations to code or vary the perimeter of the figure according to the deviation as described above. The resulting coded figure is then passed to the display device 22 to represent the data set for visualization. For each subsequent data set the display processor 20 either changes the diameter of the normalized figure, or otherwise adjusts the diameter of the preceding normalized figures as described below.

Figure 3:
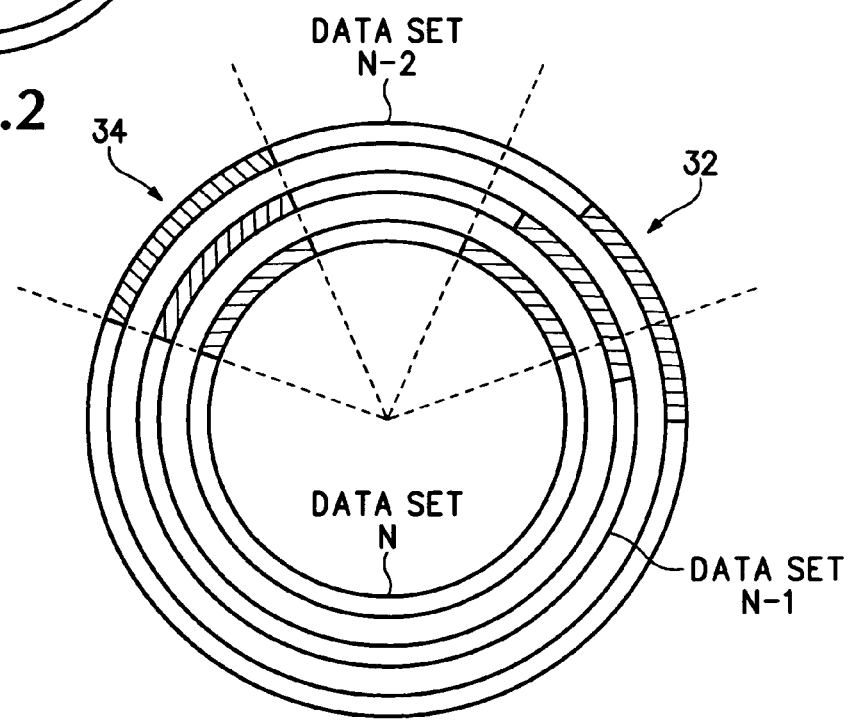
FIG. 3 is a plan view of a time progression of data displaying a time sequence of 2-dimensional data according to the present invention.

Referring now to FIG. 3 concentric circles are used to capture a sequence of 2-dimensional data sets. As additional sets of data are processed, additional circles are generated. As each new set of 2-dimensional data is turned into its corresponding circular representation, the circle representing the older sets of 2-dimensional data usually increases their radius to allow the new set of 2-dimensional data to be displayed as a center concentric circle. In other words the outer circle represents the oldest 2-dimensional data so the newest data set is at the center. In other words the inner circle may be the most recent set of data with the older data "rippling" outward. When the display screen is filled, the oldest data sets are dropped. Alternatively the new set of two-dimensional data may be represented by a circle having an ever increasing radius, while circles for the older data sets have their respective radii unchanged. In other words the outer circle is the newest data with the older data "rippling" inward. When the display screen is filled, then the circle representing the newest data remains unchanged, and all prior data sets have their radii decreased, with the central circle representing the oldest data being eliminated. This process is applied to all currently displayed data sets to produce a time sequence that grows out from the center circle or shrinks into the center circle, the center circle representing either the newest or oldest data set. The important result is concentric, non-overlapping circles representing a time sequence of 2-dimensional data sets. In the example shown data set N represents the newest in time data set, N-1 is the second newest in time, N-2 is the next newest in time, etc. until the display area is consumed.

This radial difference from circle to circle allows the display to represent a time sequence of 2-dimensional data sets in a manner that provides for the visual detection of patterns within the time sequence. A version of a rotational change is captured in the upper-right portion of FIG. 3—the "red" area 32 is rotating counter-clockwise as time progresses in this example. A magnitude change is captured in the upper-left portion of FIG. 3—the deviation is moving toward the center of the circle segment 34 as time progresses. Thus potentially many patterns that are difficult to detect using current overlapping display techniques, such as a Constellation diagram or a confusing translation necessary for a Spectrogram or waterfall diagram, are readily visible.

An extension of this technique is to use a pointing device, such as a mouse cursor or touch screen pointer either alone or in conjunction with a knob, to select a particular one of the concentric figures for further examination and move in and out from one concentric normalized figure to another. Selecting the particular normalized figure provides the ability to view the corresponding data set using a more traditional display technique to provide additional details that the traditional display technique may provide. When a time sequence figure is not selected, a conventional display may be displayed along with the concentric figure display to facilitate learning the correspondence between the traditional display techniques and this new display technique.

Thus the present invention provides a method of displaying a time sequence of 2-dimensional data as concentric, non-overlapping figures, one figure for each data set, to allow for the detection of time varying patterns, such as rotational and magnitude changes, in a single display.

What is claimed is:

1. A method of visualizing a time sequence of vector information associated with 2-dimensional data that represents a radio frequency communication signal comprising the steps of:
   acquiring the 2-dimensional data as a data set;
   generating a normalized figure having a perimeter for a reference set of data;
   determining deviations of the data set from the reference set of data;
   coding the perimeter of the normalized figure according to the deviations to produce a coded normalized figure; and
   displaying the coded normalized figure to enable visualization of the time sequence of vector information associated with the 2-dimensional data.

2. The method as recited in claim 1 further comprising the step of repeating the acquiring, generating, determining, coding and displaying steps so that the normalized figure for each successive data set is concentric with the normalized figures for all preceding data sets.

3. The method as recited in claim 1 or 2 wherein the coding step comprises the step of color coding the perimeter according to the deviations.

4. The method as recited in claim 3 wherein the color coding step comprises the steps of:
   using colors from one end of a color spectrum to represent deviations that are greater than the reference set of data; and
   using colors from an opposite end of the color spectrum to represent deviations that are smaller than the reference set of data.

5. An apparatus for visualizing a time sequence of vector information associated with 2-dimensional data that represents a radio frequency communication signal comprising:
   means for acquiring the 2-dimensional data as a data set;
   means for generating a normalized figure having a perimeter for a reference set of data;
   means for determining deviations of the data set from the reference set of data;
   means for coding the perimeter of the normalized figure according to the deviations to produce a coded normalized figure; and
   means for displaying the coded normalized figure to enable visualization of the time sequence of vector information associated with the 2-dimensional data.

6. The apparatus as recited in claim 5 further comprising means for adjusting the normalized figures so that each successive data set acquired by the acquiring means produces a set of concentric normalized figures.

7. The apparatus as recited in claim 5 or 6 wherein the coding means comprises means for color coding the perimeter according to the deviations.

8. The apparatus as recited in claim 7 wherein the color coding means comprises means for adjusting the color representing deviations to be at one end of a color spectrum when the deviations are greater than the reference set of data and to be at an opposite end of the color spectrum when the deviations are smaller than the reference set of data.

9. An apparatus for visualizing a time sequence of vector information associated with 2-dimensional data that represents a radio frequency communication signal comprising:
   a data source for generating a set of 2-dimensional data as a data set;
   a processor having the data set and a reference set of data as inputs and providing a normalized figure based upon the reference set of data as an output, the normalized figure having a perimeter with variations representing deviations of the data set from the reference set of data;

and a display having the normalized figure as an input for presenting a visualization of the time sequence of vector information associated with the 2-dimensional data.

10. The apparatus as recited in claim 9 wherein the data source receives an input signal and converts the input signal into the set of 2-dimensional data.

11. The apparatus as recited in claim 9 wherein the data source generates multiple sets of 2-dimensional data in time sequence to produce time sequential data sets and wherein the processor generates a separate normalized figure for each data set of the time sequential data sets to produce a series of concentric normalized figures with a newest set of 2-dimensional data being at the center.

12. The apparatus as recited in claim 9 wherein the data source generates multiple sets of 2-dimensional data in time sequence to produce time sequential data sets and wherein the processor generates a separate normalized figure for each data set of the time sequential data sets to produce a series of concentric normalized figures with an oldest set of 2-dimensional data being at the center.

13. The apparatus as recited in claim 9 wherein the processor color codes the variations.

14. The apparatus as recited in claim 13 wherein the processor color codes the variations that are greater than the reference set of data by using colors at one end of a color spectrum and color codes the variations that are smaller than the reference set of data by using colors at an opposite end of the color spectrum.

* * * * *